US 8,385,498 B2
(12) United States Patent
Anthony

(10) Patent No.: US 8,385,498 B2
(45) Date of Patent: Feb. 26, 2013

(54) BOOSTED CHARGE TRANSFER CIRCUIT

(75) Inventor: Michael P. Anthony, Andover, MA (US)

(73) Assignee: Kenet, Inc., Woburn, MA (US)

( * ) Notice: Subject to any disclaimer, the term of this patent is extended or adjusted under 35 U.S.C. 154(b) by 1333 days.

(21) Appl. No.: 11/807,914

(22) Filed: May 30, 2007

(65) Prior Publication Data
US 2007/0279507 A1 Dec. 6, 2007

Related U.S. Application Data

(60) Provisional application No. 60/809,485, filed on May 31, 2006.

(51) Int. Cl.
*G11C 19/28* (2006.01)

(52) U.S. Cl. ............... 377/57; 377/58; 377/61; 377/63

(58) Field of Classification Search .................. None
See application file for complete search history.

(56) References Cited

U.S. PATENT DOCUMENTS

| | | | |
|---|---|---|---|
| 3,900,743 A | 8/1975 | Weimer | |
| 3,969,636 A | 7/1976 | Baertsch et al. | |
| 4,138,665 A | 2/1979 | Eichelberger et al. | |
| 4,224,585 A | 9/1980 | Tanaka | |
| 4,395,643 A * | 7/1983 | Lehmann | 327/308 |
| 4,716,580 A | 12/1987 | Berger | |
| 4,731,552 A * | 3/1988 | Miyamoto | 327/306 |
| 4,760,287 A * | 7/1988 | Goto et al. | 327/63 |
| 4,845,383 A * | 7/1989 | Iida | 327/91 |
| 5,149,954 A | 9/1992 | Pettijohn et al. | |
| 5,291,083 A | 3/1994 | Blalock et al. | |
| 5,339,275 A | 8/1994 | Hyatt | |
| 5,349,303 A | 9/1994 | Gerpheide | |
| 5,475,332 A * | 12/1995 | Ishimoto | 327/427 |
| 5,909,131 A | 6/1999 | Singer et al. | |
| 5,999,043 A * | 12/1999 | Zhang et al. | 327/558 |
| 6,249,181 B1 | 6/2001 | Marble | |
| 6,356,148 B1 | 3/2002 | Marble | |
| 6,463,566 B1 | 10/2002 | Paul | |
| 6,559,895 B1 | 5/2003 | Dosho et al. | |
| 6,566,943 B1 | 5/2003 | Marble | |
| 6,600,513 B1 | 7/2003 | Ozumi | |
| 6,608,503 B2 * | 8/2003 | Shenai et al. | 327/77 |
| 6,867,718 B2 | 3/2005 | Cesura et al. | |
| 7,023,373 B2 | 4/2006 | Da Fonte Dias | |
| 7,129,766 B2 * | 10/2006 | Steinhagen | 327/427 |
| 2001/0019361 A1 | 9/2001 | Savoye | |
| 2004/0160351 A1 | 8/2004 | Rossi | |
| 2005/0024122 A1 * | 2/2005 | Evers et al. | 327/427 |
| 2005/0151679 A1 | 7/2005 | Adams | |

FOREIGN PATENT DOCUMENTS

| | | |
|---|---|---|
| JP | 59 021059 | 2/1984 |
| JP | 60 149165 | 8/1985 |
| JP | 61-093661 | 5/1986 |
| JP | 62-228172 | 10/1987 |
| WO | WO99/17296 | 3/2000 |

OTHER PUBLICATIONS

Frey, W., "Bucket-brigade Devices with Improved Charge Transfer," *Electron. Lett.*, vol. 9, pp. 588-589, (Dec. 13, 1973).

(Continued)

*Primary Examiner* — Tuan T Lam
(74) *Attorney, Agent, or Firm* — Cesari and McKenna, LLP

(57) ABSTRACT

A charge transfer circuit, such as a charge coupled device or other bucket brigade device, which incorporates an amplifier to assist with charge transfer.

24 Claims, 9 Drawing Sheets

OTHER PUBLICATIONS

Jespers, Paul G. A., et al., "A Fast Sample and Hold Charge-Sensing Circuit for Photodiode Arrays," IEEE Journal of solid-State Circuits, vol. SC-12, No. 3:232-237 (Jun. 1977).

Heller, L. G. et al., "Charge Transfer Compensation Circuit," IP.com, Technical Disclosure, (IP.com No. TPCOM000080916D), (Mar. 1, 1974).

Translation of First Official Action "Notice of Reason for Rejection" issued from the Japanese Patent Office on Jul. 24, 2012 for Japanese Patent Application No. 2009-513290, filing date May 31, 2007 for Boosted Charge Transfer Circuit, 4 pages.

* cited by examiner

BOOSTED CHARGE TRANSFER CIRCUIT

RELATED APPLICATION

This application claims the benefit of U.S. Provisional Application No. 60/809,485, filed on May 31, 2006. The entire teachings of the above application are incorporated herein by reference.

BACKGROUND OF THE INVENTION

In charge-domain signal-processing circuits, signals are represented as charge packets. These charge packets are stored, transferred from one storage location to another, and otherwise processed to carry out specific signal-processing functions. Charge packets are capable of representing analog quantities, with the charge-packet size in coulombs being proportional to the signal represented. Charge-domain operations such as charge-transfer are driven by 'clock' voltages, providing discrete-time processing. Thus, charge-domain circuits provide analog, discrete-time signal-processing capability.

Charge-domain circuits are implemented as charge-coupled devices (CCDs), as Metal Oxide Semiconductor (MOS) bucket-brigade devices (BBDs), and as bipolar BBDs. The present invention pertains primarily to MOS BBDs; it also has application to CCDs, in the area of charge-packet creation. Note that all circuits discussed below assume electrons as the signal-charge carriers, and use N-Channel Field Effect Transistors (NFETs) or N-channel CCDs for signal-charge processing. The identical circuits can be applied equally well using holes as charge carriers, by employing PFETs or P-channel CCDs and with reversed signal and control voltage polarities.

In MOS BBDs the charge packets are stored on capacitors. Charge transfer from one storage capacitor to the next occurs via a FET connected in common-gate configuration. The process of charge transfer in a BBD is explained with the aid of FIG. 1 and FIG. 2. These figures omit many practical details, but they suffice to show the essential features of charge transfer in conventional BBDs.

FIG. 1 shows the essential circuit elements for a BBD-type charge transfer. In FIG. 1 $V_X$ is an input voltage applied to the first terminal of capacitor 1. The second terminal of capacitor 1 and the source terminal of FET 2 are connected at node 4. The gate of FET 2 is connected to a voltage $V_G$, presumed in this discussion to be held constant. The drain of FET 2 and first terminal of load capacitor 3 are connected at node 5. The other terminal of load capacitor 3 is connected to circuit common ('ground').

FIG. 2 shows voltage waveforms associated with the circuit of FIG. 1. At the beginning of a charge-transfer cycle $V_X$ is at a high voltage 21; node 5 has been initialized to a relatively high voltage 23; and node 4 to a lower voltage 22. For this basic explanation, it is assumed that voltage 22 is more positive than $V_G-V_T$, where $V_T$ is the threshold of FET 2. Under these conditions FET 2 is biased below threshold, so no significant current flows through it.

The charge transfer is initiated at time $t_1$ by lowering $V_X$ towards a more negative voltage. Initially, $V_4$, the voltage of node 4, follows VX in a negative direction. At time $t_2$, $V_4$ becomes equal to $V_G-V_T$, causing FET 2 to turn on. The resulting current flow through FET 2 limits further negative excursion of $V_4$. At time $t_3$ $V_X$ reaches its lower value 24. Current continues to flow through FET 2 into capacitor 1, causing node 4 to charge in a positive direction. As $V_4$ approaches $V_G-V_T$, the current through FET 2 diminishes. $V_4$ settles towards $V_G-V_T$ at a continuously-diminishing rate, reaching voltage 26 at time $t_4$. At $t_4$ $V_X$ is returned to its original voltage. This positive-going transition is coupled through capacitor 1 to node 4, causing FET 2 to turn off altogether and ending the charge transfer.

During the events described, current flows from capacitor 3 through FET 2 into capacitor 1. The integral of this current flow constitutes the transferred charge, $Q_T$. $Q_T$ can be expressed in terms of the voltage changes and respective capacitances at $V_X$, node 4, and node 5. Neglecting the device capacitances of FET 2, the charge delivered to capacitor 3 can be expressed in terms of the voltage change across it, using the well-known expression Q=CV. Identifying the capacitance of capacitor 3 as $C_3$ and the voltage change at node 5 as $\Delta V_5$, we have:

$$Q_T = C_3 \Delta V_5 \qquad \text{Equation 1}$$

Note that with the waveforms shown, $\Delta V_5$=(voltage 25–voltage 23) is negative, so $Q_T$ is negative; i.e., it consists of electrons.

$Q_T$ can also be expressed in terms of the voltage change across capacitor 1. Using similar notation, we have:

$$Q_T = C_1(\Delta V_X - \Delta V_4) \qquad \text{Equation 2}$$

The relevant voltage changes occur between the beginning and the end of charge transfer; thus, for the waveforms of FIG. 2, $$\Delta V_X = (\text{voltage 24–voltage 21}) \qquad \text{Equation 3}$$

and $$\Delta V_4 = (\text{voltage 26–voltage 22}) \qquad \text{Equation 4}$$

For the conditions described, voltage 22 is a constant (it is an initial condition). If node 4 were to settle perfectly to its nominal asymptote $V_G-V_T$, which is also a constant, then $\Delta V_4$ would be a constant. In that case, Equation 2 could be re-written as:

$$Q_T = C_1 \Delta V_X + (\text{constant}) \qquad \text{Equation 5}$$

This expression represents an idealization of the charge-transfer operation which is perfectly linear. For the realistic case in which settling of node 4 is imperfect, Equation 2 can be re-formulated as:

$$Q_T = C_1[\Delta V_X - (\text{voltage 26})] + (\text{constant}) \qquad \text{Equation 6}$$

From this form it can be seen that any non-linearity or incomplete settling of charge transfer is attributable to voltage 26, the voltage of node 4 at the end of charge-transfer.

Charge-transfer operation essentially similar to that described above is used in all conventional BBDs. Practical details, such as the means of establishing the described initial conditions, realistic clock waveforms, etc. are not pertinent to the present invention and will not be further described here. The same charge-transfer technique is also used to provide charge-packet input in many CCD signal-processing circuits. (Subsequent charge transfers in CCDs use a different principle, not described here.)

The mode of charge-transfer described above will be termed "passive" charge transfer in the following discussion. This term refers to the fact that, during the charge-transfer process, the gate voltage $V_G$ applied to FET 2 is static, not actively controlled in response to the charge being transferred. (In practical BBDs, $V_G$ is typically clocked rather than static, but it is not responsive to the charge being transferred.) This passive charge transfer process is subject to two important error sources.

The first error source derives from the nature of the settling of node 4 during the $t_3$-to-$t_4$ interval in FIG. 2. During this time, as described above, node 4 is charging in a positive direction, reducing the gate-source voltage of FET 2. This decreasing gate-source voltage causes a decrease in current through the FET. This declining current in turn results in a declining rate of charging of node 4. This process is very non-linear in time, and also depends in a non-linear manner on the size of charge packet being transferred. As a result, the residual voltage 26 in FIG. 2 (and Equation 6) depends non-linearly on $Q_T$, resulting in an overall non-linear charge-transfer operation. Moreover, with practical circuit values, the settling time of node 4 is unacceptably long for high-speed circuit operation. Passive charge-transfer is thus both slow and non-linear; in many applications these limitations degrade speed and accuracy unacceptably.

The second error source arises due to the change $\Delta V_5$ in FET drain voltage $V_5$. As shown above (Equation 1) this change is proportional to $Q_T$. FETs exhibit a feedback effect, in which a variation in drain voltage causes, in effect, a variation in threshold voltage $V_T$. Thus the "final" voltage $V_G$–$V_T$, towards which $V_4$ settles, is not in fact a constant (as in the idealized discussion above) but a function of the charge being transferred. This effect is equivalent to a dependency of voltage 26 on the size of $Q_T$: larger $|Q_T|$ results in a more-negative value of voltage 26. This effect amounts to a charge-transfer gain of less than 100%. It typically includes a small non-linear component as well, exacerbating the non-linearity issue discussed above.

SUMMARY OF THE INVENTION

Embodiments of the present invention provide a charge-transfer circuit in which the effects of the two error sources described above are significantly reduced. In contrast to the passive charge transfer used in conventional BBDs, the charge transfer method of the present invention is termed "boosted". The performance of a boosted charge-transfer circuit is sufficiently improved over that of the passive circuit that it makes high-speed, high-precision applications feasible.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of preferred embodiments of the invention follows.

The present invention provides a charge-transfer circuit in which the effects of the two error sources described above are significantly reduced. In contrast to the passive charge transfer used in conventional BBDs, the charge transfer method of the present invention is termed "boosted". The performance of a boosted charge-transfer circuit is sufficiently improved over that of the passive circuit that it makes high-speed, high-precision applications feasible. This boosted charge-transfer technique can be understood with the aid of FIGS. 3 and 4, which illustrate the basic features of its operation.

Figure 1:
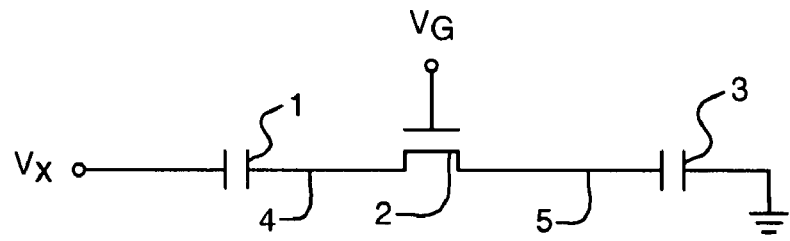
FIG. 1 is a simplified diagram of a charge transfer circuit.
Figure 3:
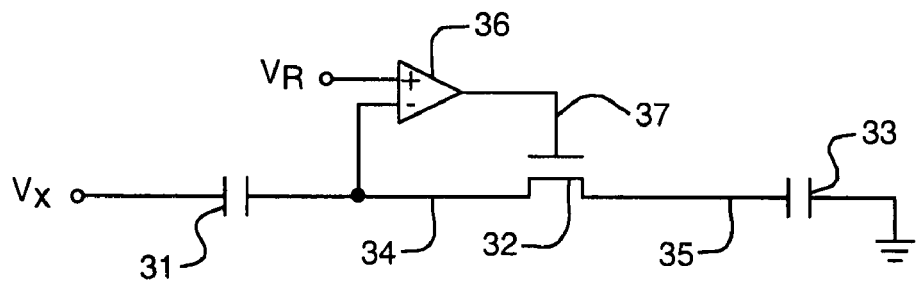
FIG. 3 is a boosted charge transfer circuit according to aspects of the invention.

The elements of FIG. 3 are the same as similarly-identified elements of FIG. 1, except for the addition of amplifier 36 and its reference voltage $V_R$, and the omission of voltage $V_G$. Capacitor 31 in FIG. 3 corresponds to capacitor 1 in FIG. 1, node 34 to node 4, etc. The added amplifier 36 is the unique feature of this invention; it has moderate voltage gain (typically 10-100) and very high speed.

Figure 2:
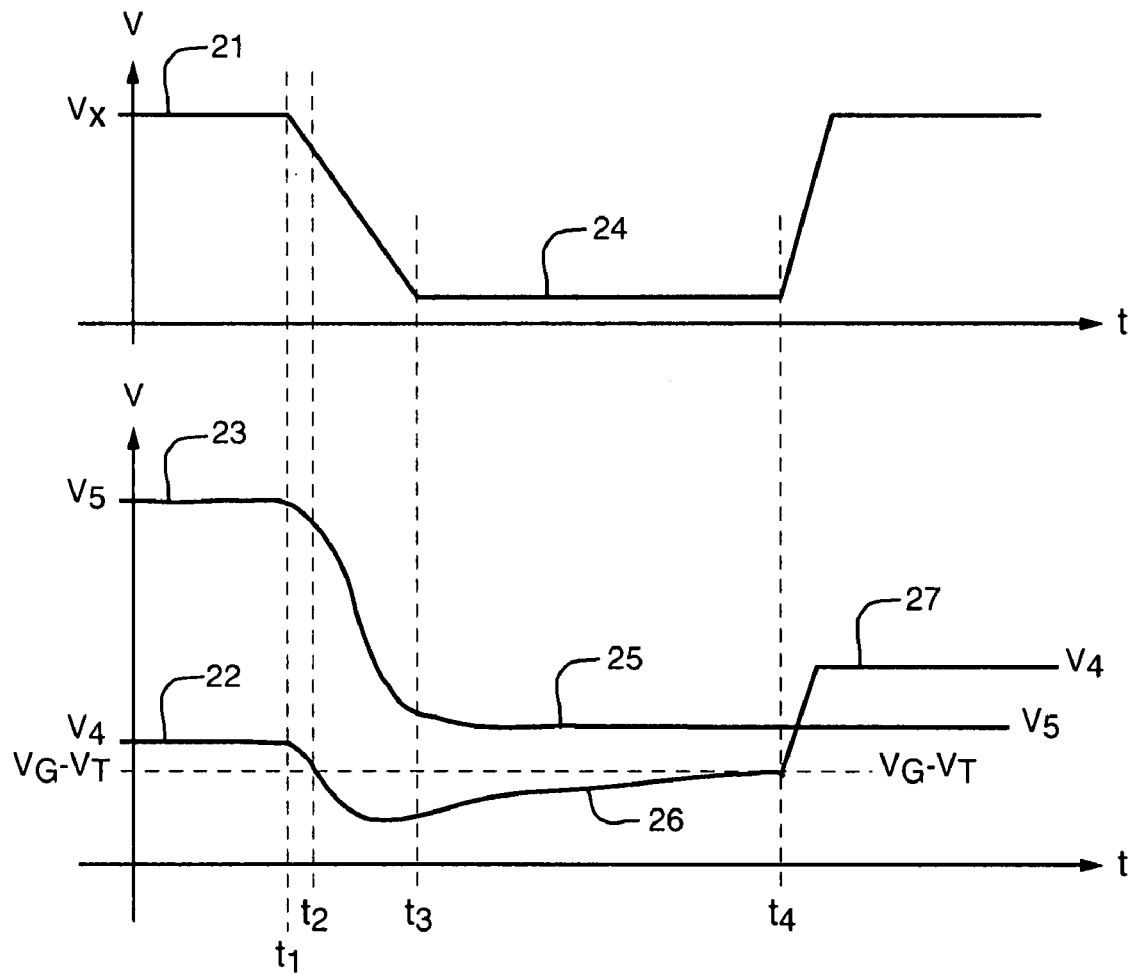
FIG. 2 illustrates voltage waveforms associated with FIG. 1.
Figure 4:
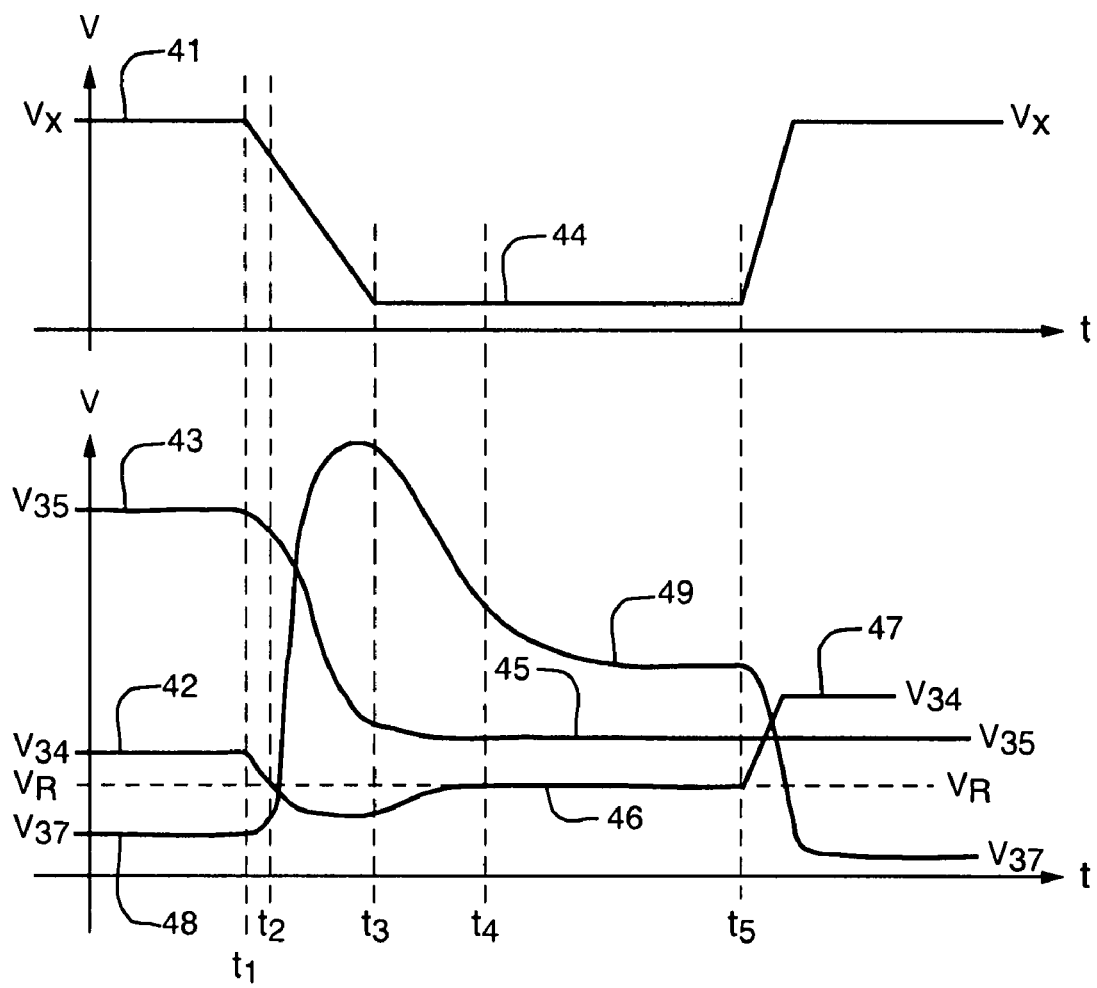
FIG. 4 illustrates voltage waveforms for the circuit of FIG. 3.

The operating waveforms of this circuit are shown in FIG. 4, using the same naming conventions employed in FIG. 2 (e.g., the voltage of node 34 is called $V_{34}$, etc.). Initial conditions in FIG. 4 are similar to those in FIG. 2. Input voltage $V_X$ starts at a high value, 41. Drain node 35 is initialized to a high voltage 43. Source node 34 is initialized to a lower voltage 42, which is more positive than $V_R$. Because $V_{34} > V_R$, amplifier 36 drives its output, node 37, to a low voltage 48. Node 37 is also connected to the gate of FET 32, so a low value of $V_{37}$ assures that FET 32 is initially turned off, and no current flows through it.

The charge transfer is initiated at time $t_1$ by lowering $V_X$ towards a more negative voltage. Initially, $V_{34}$ follows $V_X$ in a negative direction. At time $t_2$, $V_{34}$ becomes more negative than $V_R$, causing amplifier 36 to drive its output node 37 to a high voltage. This high voltage turns on FET 32; the resulting current through FET 32 limits the negative excursion of node 34. Amplifier 36 then operates, by feedback via FET 32, to maintain $V_{34}$ slightly below $V_R$. This balance persists until time $t_3$ when $V_X$ reaches its lower value 44. The current flowing through FET 32 then charges node 34 positively until $t_4$, when $V_{34}$ approaches $V_R$. As its input drive ($V_{34}$–$V_R$) approaches zero, amplifier 36 drives its output voltage 37 towards a lower value 49, and the current through FET 32 declines rapidly. Finally, at time $t_5$, $V_X$ is returned to its original value; this positive-going transition is coupled through capacitor 31 to node 34, causing amplifier 36 to again drive its output node 37 to a low voltage, turning FET 32 off and ending the charge transfer.

As with the passive charge transfer previously described, the current flowing through FET 32 is integrated by capacitor 33, resulting in the voltage waveform $V_{35}$ at node 35. This integrated current constitutes the transferred charge, $Q_T$. The charge and voltage on capacitor 33 are related just as in Equation 1:

$$Q_T = C_{33} \Delta V_{35} \qquad \text{Equation 7}$$

Where $\Delta V_{35}$=(voltage 45−voltage 43).
Similarly, $$Q_T = C_{31}(\Delta V_X - \Delta V_{34}) \qquad \text{Equation 8}$$

And by analogy with Equation 6, $$Q_T = C_{31}[\Delta V_X - (\text{voltage 46})] + (\text{constant}) \qquad \text{Equation 9}$$

The asymptote towards which $V_{34}$ settles is $V_R$, the reference voltage for amplifier 36. In FIG. 4 the value of $V_{34}$ at the end of charge transfer (time $t_5$) is voltage 46. As with the passive charge transfer, any difference between voltage 46 and $V_R$ represents an error in the transferred charge. The key difference between the boosted and passive charge transfer lies in the improved precision and speed with which $V_{34}$ approaches $V_R$.

In both passive and boosted charge-transfer circuits, the source voltage of the FET (nodes 4 and 34 in FIGS. 1 and 3 respectively) is charged positively by the FET current after $t_3$. This charging results in decreasing gate-source voltage $V_{GS}$ and FET current $I_D$, as described above. In the passive circuit of FIG. 1, the gate voltage $V_G$ is fixed, so the rate of change of $V_{GS}$ is simply the negative of that of $V_4$:

$$dV_{GS}/dt = -dV_4/dt = -I_D/C_1 \qquad \text{Equation 10}$$

In the boosted charge-transfer circuit of FIG. 3, the same equation applies (to $V_{34}$ and $C_{31}$ respectively). However, the gate of FET 32 is not held at a constant voltage, but driven by the output of amplifier 36, which responds to the voltage at node 34 with gain A (typically 10-100 as mentioned above). Thus the gate-source voltage of FET 32 is:

$$V_{GS} = V_{37} - V_{34} = -A(V_{34} - V_R) - V_{34} = A[V_R - (1 + A^{-1})V_{34}] \qquad \text{Equation 11}$$

Since $V_R$ is constant, the rate of change of $V_{GS}$ for the boosted charge transfer circuit of FIG. 3 is thus:

$$dV_{GS}/dt = -(A+1)dV_{34}/dt = -(A+1)I_D/C_1 \qquad \text{Equation 12}$$

Comparing Equation 12 to Equation 10 shows that the rate at which $V_{GS}$ settles is increased by the gain of amplifier 36 compared to the passive case. The time required after $t_3$ for settling to any given level of precision is similarly reduced. The non-linearity of the final voltage 46 is similarly reduced by approximately the same factor relative to final voltage 26 in FIG. 2.

In the preceding material, a number of important circuit details were omitted for the sake of clarity in the basic explanation. These details are described in the following paragraphs.

As stated above, the gain of the amplifier in a boosted charge transfer circuit, such as amplifier 36 in FIG. 3, needs to be high enough to produce a significant improvement in linearity and speed. Voltage gain in the range of 10-100 produces substantial benefits. Significantly lower gain reduces the linearity improvement, and higher gain results in dynamic problems described in more detail below. Charge-transfer settling time is also related to the speed of the amplifier, as discussed below. Thus design of the amplifier is constrained by the dual requirements of medium gain and very high speed. Several practical circuits which satisfy these constraints are described below.

Figure 5:
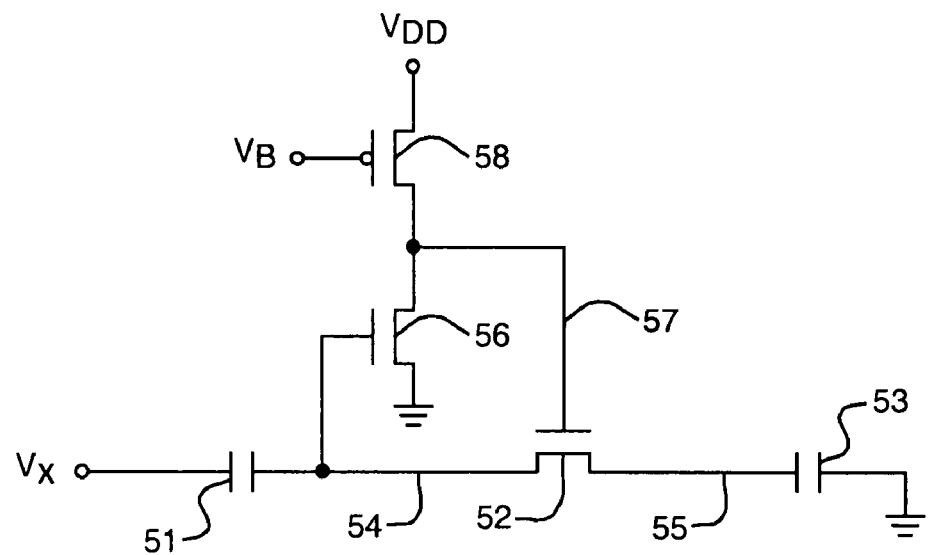
FIG. 5 is a boosted charge transfer circuit incorporating a CMOS amplifier.

FIG. 5 shows a boosted charge-transfer circuit incorporating a basic CMOS amplifier which provides the needed performance. Elements $V_X$, capacitors 51 and 53, and charge-transfer FET 52 are arranged just as in FIG. 3. The amplifier, 36 in FIG. 3, is implemented in FIG. 5 as common-source-connected NFET 56, and PFET 58 which is connected as a current source with positive supply $V_{DD}$ and bias voltage $V_B$. Operation of this circuit is just as described in connection with FIGS. 3 and 4. The equivalent in FIG. 5 of amplifier reference voltage $V_R$ in FIG. 3 is the voltage at node 54 at which the drain current of NFET 56 balances the drain current of PFET 58. This voltage is slightly above the threshold of NFET 56. This type of circuit can have voltage gain in the required range. Its speed can be chosen by scaling FETs 56 and 58 and their operating current: larger FETs and more current result in higher speed, with the limit being characteristic of the particular semiconductor fabrication process.

While suitable for some applications, the circuit of FIG. 5 has a significant performance limitation. All charge-transfer circuits add thermal noise to the transferred charge packet. This added noise is often referred to as "kTC" noise, because in simple cases it obeys the law:

$$Q_n = (kTC)^{1/2} \qquad \text{Equation 13}$$

where $Q_n$ is the added noise in coulombs, T=absolute temperature, k=Boltzmann's constant, and C is the capacitor involved in the charge transfer. Equation 13 applies, for example, to the passive charge-transfer circuit of FIG. 1, where the pertinent C is that of capacitor 1, plus the previously-neglected parasitic capacitances at node 4. (In some cases the noise added by the circuit of FIG. 1 may be slightly less than the amount indicated by Equation 13.)

In the circuit of FIG. 5, the total capacitance contributing to noise generation includes three significant terms: the explicit value of capacitor 51; the gate-input capacitance of amplifier FET 56; and the capacitance from node 57 to node 54 multiplied by the gain of the amplifier. This latter capacitance term, which is multiplied by the amplifier gain, is sometimes referred to (for historical reasons) as "Miller" capacitance. In FIG. 5 it consists of the drain-to-gate capacitance of FET 56 plus the gate-to-source capacitance of FET 52. Even though the device parasitic capacitances of FETs 52 and 56 may be small compared with the value of capacitor 51, the fact that the Miller capacitance is multiplied by the amplifier gain can make it a significant noise issue in this circuit.

Figure 6:
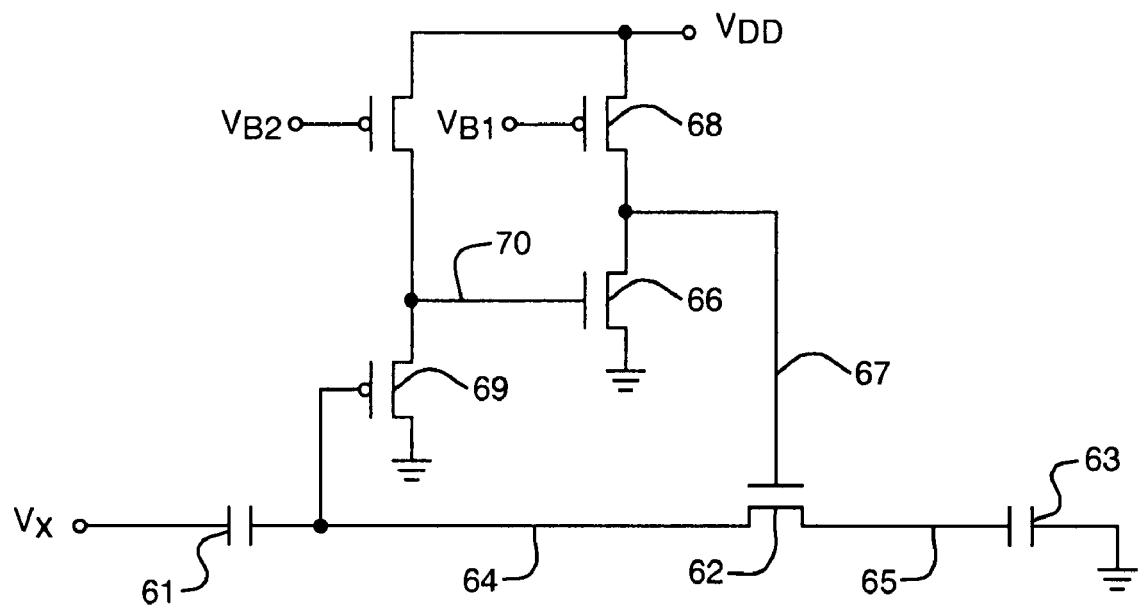
FIG. 6 is another boosted charge transfer circuit using an amplifier that reduces Miller capacitance.

FIG. 6 shows a boosted charge-transfer circuit which improves upon the circuit of FIG. 5 by reducing the Miller capacitance. The amplifier in the circuit of FIG. 6 consists of the FETs 66 and 68, serving the same functions as FETs 56 and 58 in FIG. 5. In FIG. 6 a source-follower PFET 69 is added, supplied by a PFET current-source. Because it provides voltage buffering between node 64 and node 70, the contribution of the drain-to-gate capacitance of FET 66 to the Miller capacitance is largely eliminated. Thus in FIG. 6 only the gate-source capacitance of FET 62 contributes significantly to the Miller capacitance. The result is a corresponding reduction of kTC-noise generation relative to the circuit of FIG. 5.

Figure 7:
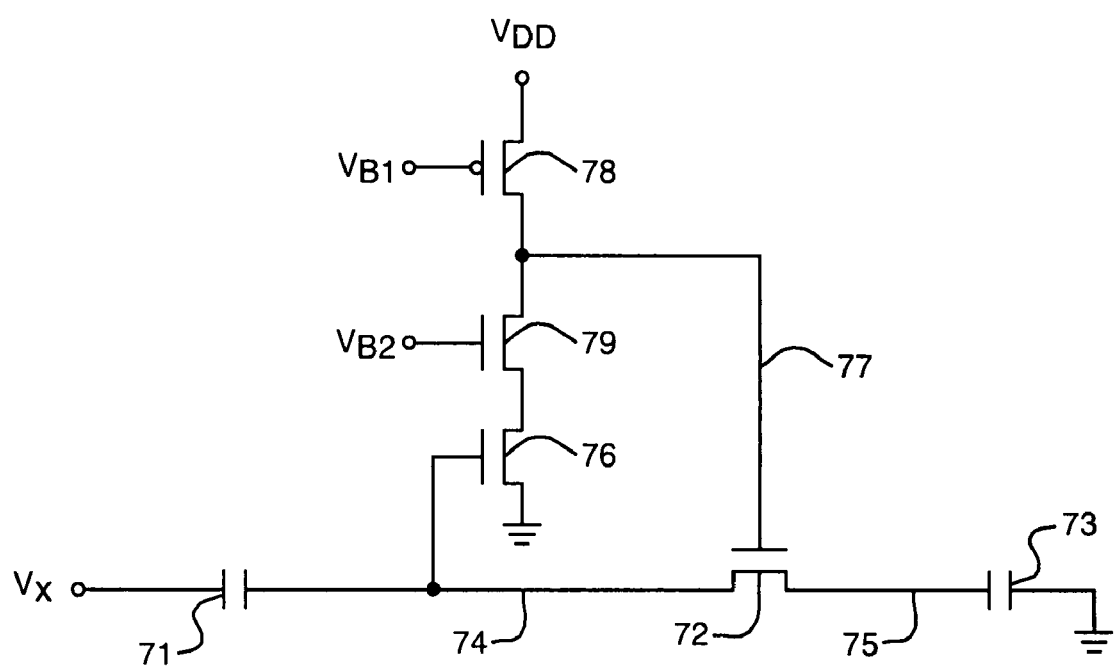
FIG. 7 is a boosted charge transfer circuit that uses an NFET as a common gate amplifier.

FIG. 7 shows another boosted charge-transfer circuit with reduced Miller capacitance. This circuit is identical to that of FIG. 5, except that the NFET 79 is added between the drain of FET 76 and the amplifier output node 77. FET 79 acts as a common-gate amplifier, with its gate biased at a constant voltage $V_{B2}$. The common-source+common-gate composite of FETs 76 and 79 is the well-known "cascode" configuration. Its effect in this application is primarily to reduce the gain from gate to drain of FET 76 while maintaining or increasing gain from node 74 to node 77. While the drain-gate capacitance of FET 76 is not reduced, the gain which multiplies it is reduced, thus reducing its contribution to kTC-noise generation.

One significant problem with the boosted charge-transfer circuit was alluded to above but not detailed there: the dynamic behavior of the circuits so far discussed may exhibit a type of instability which can disrupt the desired linear charge-transfer. This problem arises especially in the case of relatively high amplifier gain, which is otherwise desirable in order to reduce nonlinearity.

This dynamic problem arises during the early part of the charge transfer, between $t_2$ and $t_4$ in FIG. 4. In this region, the closed loop seen in FIG. 3 from node 34, through amplifier 36 to node 37, through FET 32 back to node 34, exhibits a 2-pole (second-order) gain characteristic. One pole is due to the $g_m$ of the amplifier and the capacitance at node 37; the other is due to the $g_m$ of FET 32 and capacitor 1. It is apparent that second-order loop gain is intrinsic to this basic circuit topology. Because the current through FET 32 starts at zero before $t_2$, rises to a peak, and then decays during the $t_3$–$t_5$ interval to a very small value, the circuit does not have a DC "quiescent point" at which stable conditions can be established. When the FET current drops to a sufficiently low level approaching $t_5$, then current through the gate-source capacitance of FET 32 swamps the drain-source current, and the second pole is eliminated. Consequently the final settling of the circuit is unconditionally stable. The second-order response during the middle of the charge transfer can result in 'overshoot' at nodes 37 and 34, causing a non-linear disturbance of $Q_T$.

Figure 8:
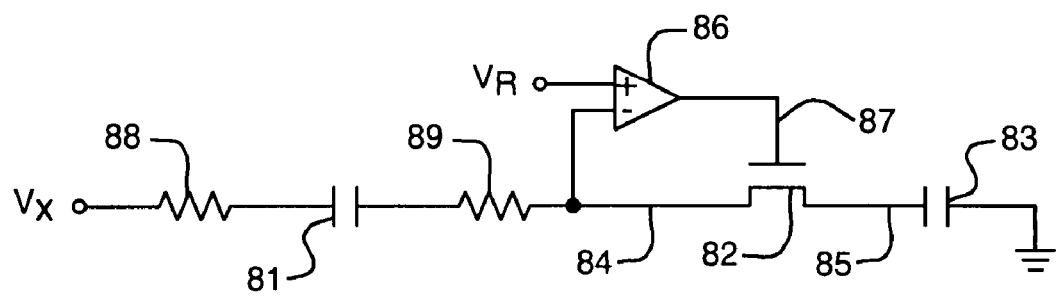
FIG. 8 is a boosted charge transfer circuit that uses resistor elements to dampen the circuit response.

A solution to this problem is shown in FIG. 8. This circuit is identical to the basic boosted charge-transfer circuit of FIG. 3, with similarly-identified elements, except that the resistors 88 and 89 are added. When appropriately sized, the sum of these resistors adds a zero which partially cancels the second pole mentioned above, thus providing an adequately damped overall response. If the combined resistance is made larger than necessary, it reduces the speed of the charge-transfer operation, reducing the benefit of the boosted circuit. With practical circuit parameters, a significant range exists for an appropriate choice of resistor values. Either resistor 88 or 89 or a combination can be used to achieve the needed effect.

Figure 9:
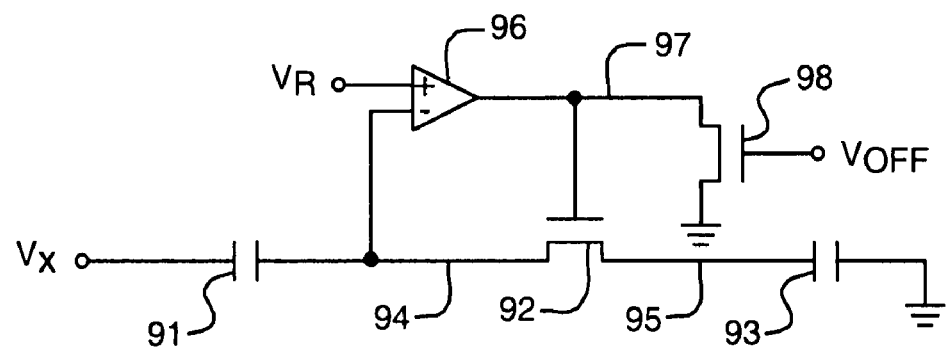
FIG. 9 is a boosted charge transfer circuit that provides greater control over start and end of current flow.

In the discussion of FIGS. 3-4 the initial voltage at node 34 was chosen to assure that FET 32 was turned off. Thus no current flowed through the FET until after $t_1$ when $V_X$ began changing. Likewise, current flow ended when $V_X$ returned to its initial value. In some applications of boosted charge transfer it is desirable to control the start and end of current flow by other means. One such means is shown in FIG. 9. This circuit is identical to the basic circuit of FIG. 3, with similarly-identified elements, except for the addition of NFET 98 which is controlled by a logic voltage signal $V_{OFF}$. When $V_{OFF}$ is high, FET 98 is turned on, and drives node 97 to near zero volts. Thus node 94 can assume any initial voltage down to zero (or even slightly below zero) without causing FET 92 to turn on (because $V_{GS}$ of FET 92 is not significantly positive). When $V_{OFF}$ is set low, then FET 98 is turned off. In this condition the circuit behaves just like that of FIG. 3: amplifier 96 can drive node 97 positive whenever the voltage of node 94 is less than $V_R$, turning FET 92 on and allowing current flow. If $V_{94} < V_R$ when $V_{OFF}$ goes low, then amplifier 96 will immediately begin driving node 97 high, initiating current flow. Similarly, setting $V_{OFF}$ high will terminate charge-transfer regardless of the state of $V_{94}$. Applications of this capability will be discussed below.

Consideration of the detailed amplifier circuits in FIGS. 5, 6, and 7 shows that a FET connected as shown in FIG. 9 can also be used in each specific case to achieve the results described for the more abstract circuit of FIG. 9.

In many applications it is desirable to minimize overall circuit power consumption. In a boosted charge-transfer circuit, charge-transfer typically only happens during part of an overall operating cycle, often 50% or less. In FIG. 4, for example, current flows only between $t_1$ and $t_5$. During the remainder of the operating cycle, the amplifier (or a switch FET such as FET 98, just discussed) holds the common-gate charge-transfer FET in an off state. In this state the amplifier is not required to respond to the input signal (at node 94, for example). Thus the current source or sources which are part of the amplifier can be disabled, eliminating power consumption. If current-flow control via a signal such as $V_{OFF}$ is used, the same signal can also be used to control power consumption.

Figure 10:
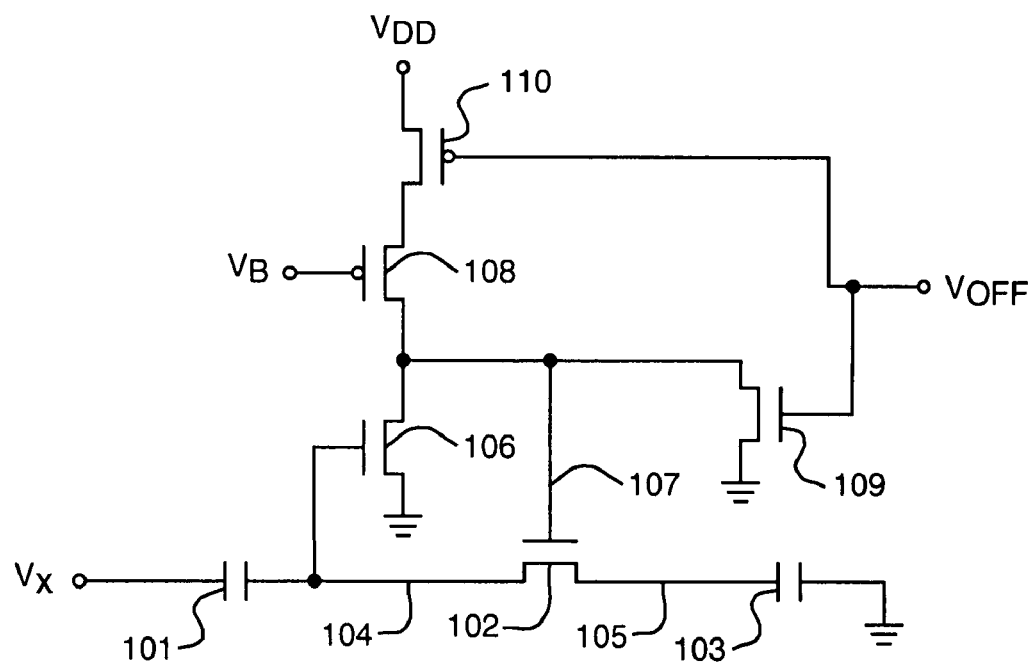
FIG. 10 is a boosted charge transfer circuit using an FET that controls power consumption.

An example of such a circuit is shown in FIG. 10. This circuit is similar to that of FIG. 5, with the addition of NFET 109 and PFET 110, both controlled by the logic voltage signal $V_{OFF}$. When $V_{OFF}$ is high, FET 109 holds node 107 at a low voltage, disabling current flow though FET 102. At the same time, FET 110 is turned off, so no current flows through current-source FET 108; thus power consumption due to the amplifier is extinguished. When $V_{OFF}$ is set low, then FET 110 turns on, enabling current flow through FET 108; and FET 109 turns off, allowing node 107 to rise and turn on FET 102, permitting signal charge to flow from node 104 to node 105.

The circuits of FIGS. 6 and 7 can be modified in ways similar to the modification just described, to disable charge transfer and eliminate power consumption by their amplifiers during the time when a control voltage $V_{OFF}$ is asserted.

Figure 11:
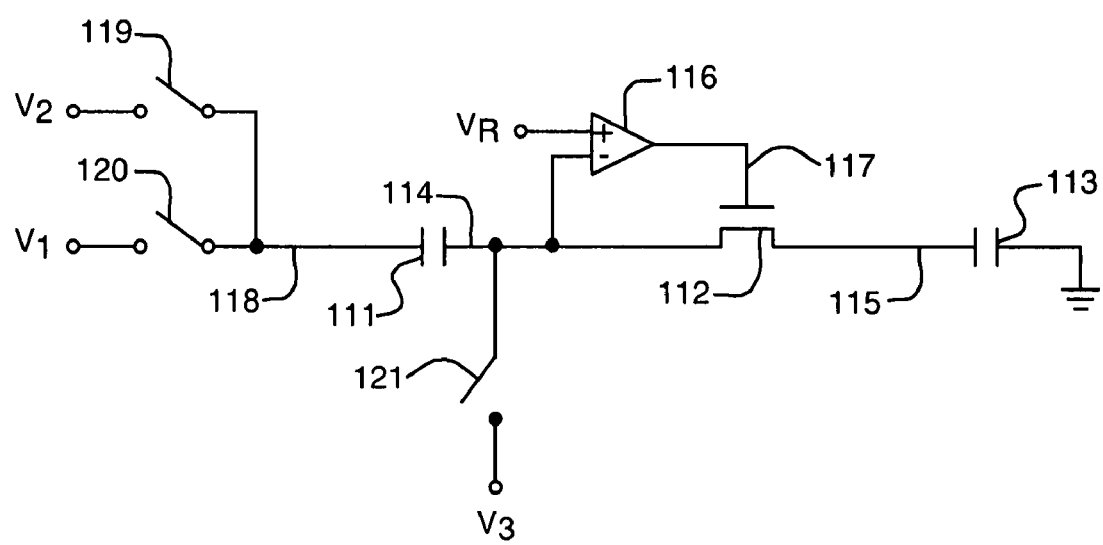
FIG. 11 is a boosted charge transfer circuit that provides a voltage-to-charge sample-and-hold function.

In all the charge-transfer circuits described above, the input signal $V_X$ is represented as an abstract voltage source. Also, the voltage at the charge-transfer FET's source, node 4 in FIG. 1 for example, is described as "initialized to voltage 22". Similar abstract initialization is assumed for the circuit of FIG. 3. For purposes of understanding the charge-transfer circuit principles discussed so far, this abstract representation sufficed. In actual applications of boosted charge-transfer circuits, however, these abstractions must be replaced by realistic circuitry. An application example is shown in FIG. 11, in which the abstract voltage control is replaced by slightly less-abstract switches. In a fully-developed practical circuit, these switches would each be implemented as an NFET, a PFET, or an NFET-PFET combination known as a 'transmission gate'. The circuit details for controlling these switches are not considered in this discussion.

FIG. 11 shows a boosted charge-transfer circuit similar to that of FIG. 3, with three additional elements: switches 119, 120, and 121. In addition, the node driven by $V_X$ in FIG. 3 is here labeled node 118. This circuit provides a voltage-to-charge sample-and-hold function, in which an output charge packet $Q_T$ delivered to capacitor 113 is a linear function of the three input voltages $V_1$, $V_2$, and $V_3$. One mode of operation of this circuit is described with the aid of FIG. 12. This operation is very similar to that of the circuit of FIG. 3, whose waveforms are shown in FIG. 4.

Figure 12:
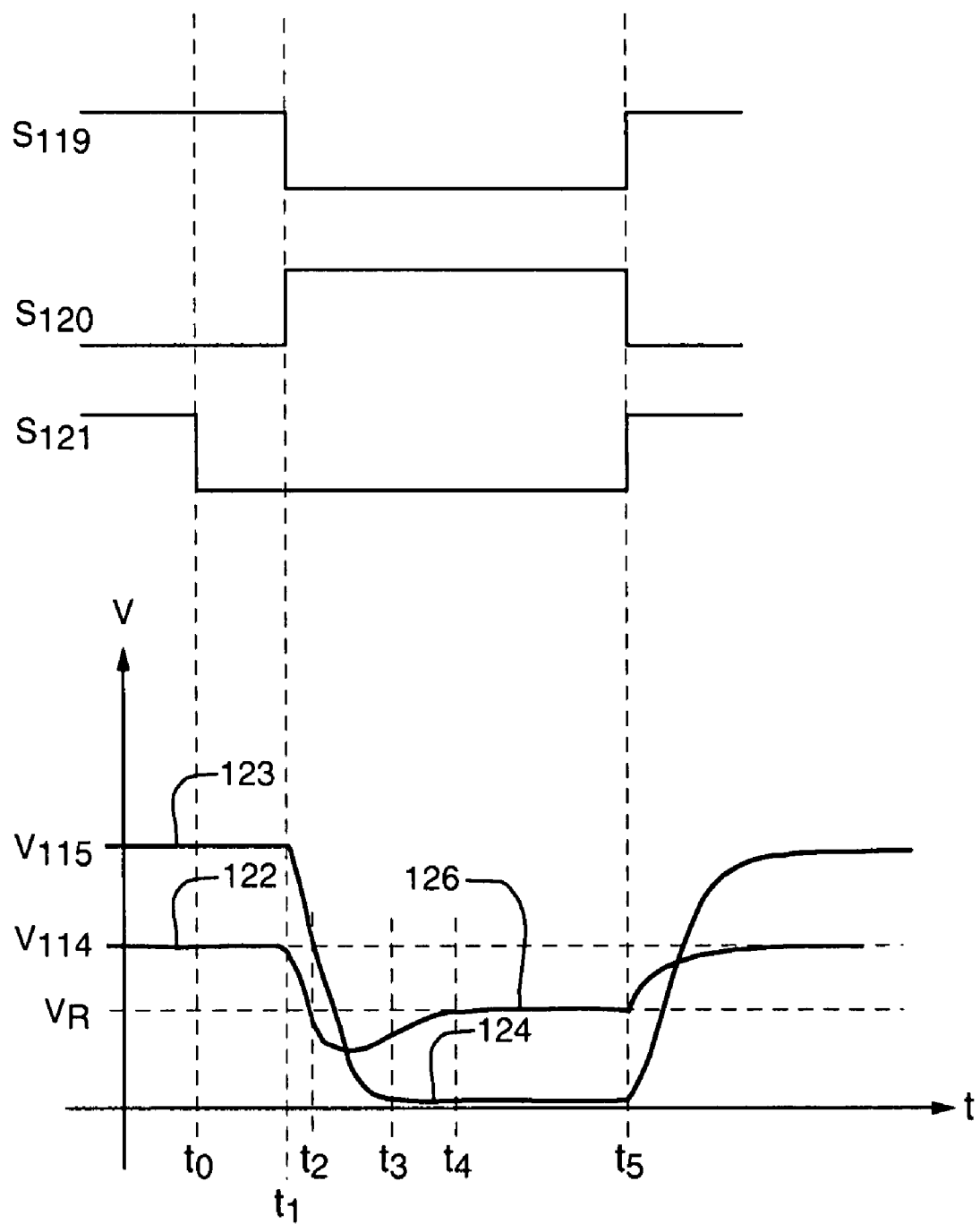
FIG. 12 illustrates voltage waveforms associated with the circuit of FIG. 11 in the case of static input voltage.

In FIG. 12, three switch states and two voltages are plotted against time. The switch states $S_{199}$, $S_{120}$ and $S_{121}$ respectively represent the states of switches 119, 120, and 121 in FIG. 11. A high value for a switch state indicates that the switch is on, and a low value indicates off. The voltages of nodes 118 and 114 are plotted below the switch states. Six times $t_0$–$t_5$ are identified. Times $t_1$–$t_5$ correspond to the five times identified in FIG. 4, emphasizing the similarity of operation of the circuits of FIG. 3 and FIG. 11. Initially, switches 119 and 121 are on; switch 120 is off. Consequently node 118 is connected to $V_2$, whose value is identified as 123 in FIG. 12; and node 114 is connected to $V_3$, whose value is identified as 122 in FIG. 12. Thus voltages 123 and 122 correspond to initial voltages 41 and 42 in FIG. 4.

At $t_0$ switch 121 turns off, leaving node 114 at voltage 122 (since no current is yet flowing through FET 112). At $t_1$ switch 119 turns off and switch 120 turns on, connecting node 118 to $V_1$. Node 118 charges towards $V_1$ with a time constant governed by the on-resistance of switch 120, eventually reaching a settled voltage 124 equal to $V_1$. $V_{118}$'s waveform is similar to that of $V_X$ in FIG. 4. Similarly, as with $V_{34}$ in FIG. 4, $V_{114}$ initially follows $V_{118}$, then stops when current flows through FET 112, and eventually settles to a voltage 126 which is very close to $V_R$. At $t_5$, all three switches return to their original states, re-connecting node 118 to $V_2$ and node 114 to $V_3$, and ending the charge transfer process.

Following the analysis applied to FIGS. 3 and 4, we can write an expression for the resulting output charge $Q_T$ which is collected by capacitor 113. By analogy with Equation 8:

$$Q_T = C_{111}(\Delta V_{118} - \Delta V_{114}) \qquad \text{Equation 14}$$

The relevant voltage changes occur between the beginning and the end of charge transfer; thus, for the waveforms of FIG. 12:

$$\Delta V_{118} = (\text{voltage 124} - \text{voltage 123}) = (V_1 - V_2) \qquad \text{Equation 15}$$

and $$\Delta V_{114} = (\text{voltage 126} - \text{voltage 122}) \approx (V_R - V_3) \qquad \text{Equation 16}$$

where the approximation in Equation 16 consists in neglecting the difference between voltage 126 and $V_R$.
Combining these equations, we have:

$$Q_T = C_{111}[(V_1 - V_2) - (V_R - V_3)] \qquad \text{Equation 17}$$

This expression shows that $Q_T$ depends linearly on the four voltages $V_1$, $V_2$, $V_3$ and $V_R$, within the approximation in equation 16. The parasitic capacitance and charge transfer associated with switch 121, and other parasitic capacitances at node 114, have been neglected in this analysis. Their effect is to add offsets to the expression for $Q_T$, but the result remains linear in the four voltages.

Figure 13:
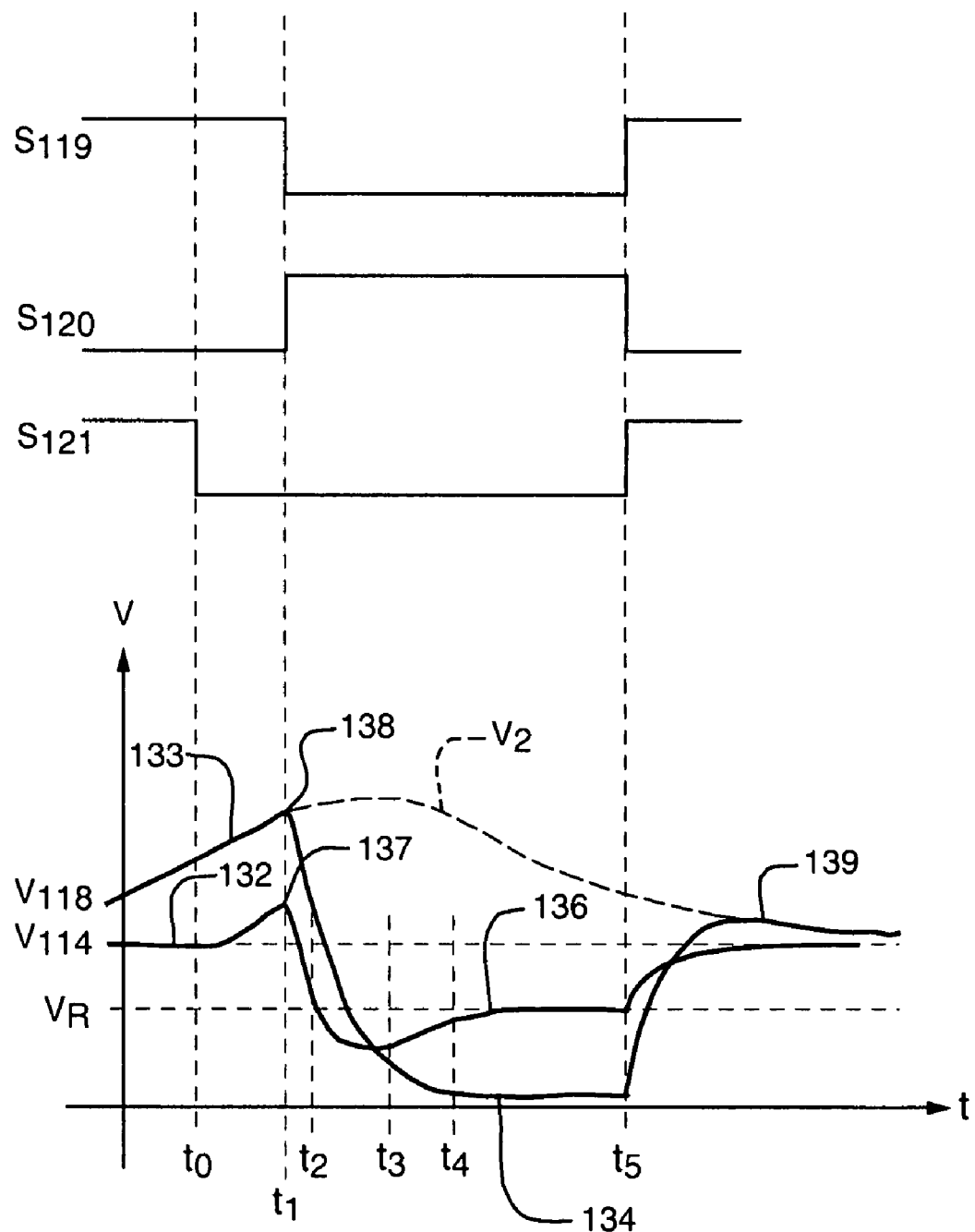
FIG. 13 illustrates voltage waveforms associated with the circuit of FIG. 12 in the case of time-varying input voltage.

The waveforms in FIG. 12 are implicitly based on the assumption that all four voltages in Equation 17 were static during the time shown. FIG. 13 shows what happens if $V_2$ is time-varying while $V_1$, $V_3$ and $V_R$ remain fixed. In this situation, it will be seen that the circuit of FIG. 11 generates an output charge $Q_T$ which depends on the value of $V_2$ at the moment when $S_{121}$ turns off. Thus this circuit provides a voltage-to-charge sample-and-hold function.

For $t < t_0$ in FIG. 13, switches 119 and 121 are turned on. Switch 121 holds node 114 at voltage 132 (equal to the value of $V_3$) as in the foregoing discussion. Switch 119 connects node 118 to the time-varying voltage source $V_2$, so that the voltage of node 118 tracks $V_2$. (The time constant of switch 119 and capacitor 111 is assumed short enough to be neglected compared to the rate of change of $V_2$.) At $t_0$ switch 121 turns off. Since node 114 is no longer connected to $V_3$, it follows node 118 due to coupling through capacitor 111 (note that in FIG. 12 node 118 was static, so $V_{114}$ did not change at this point). Neglecting parasitic capacitances, the voltage across capacitor 111 remains constant and equal to its value at $t_0$. Specifically, taking node 118 as the positive terminal of capacitor 111:

$$\Delta V_{C111} = \text{voltage 133} - \text{voltage 132} = V_2[t_0] - V_3 \qquad \text{Equation 18}$$

with $V_2[t_0]$ being the value of $V_2$ at time $t_0$. This condition persists until time $t_1$, when switch 119 turns off and switch 120 turns on. Node 118 is then driven towards voltage $V_1$ (voltage 134) as in FIG. 12. As in FIG. 12, node 114 initially follows node 118, then stops when current flows through FET 112, and eventually settles to a voltage 136 which is very close to $V_R$. As above, charge transfer stops at $t_5$ when the switches return to their initial state. Node 114 is re-connected to $V_3$ and returns to its initial value 132. Node 118 is re-connected to $V_2$, and settles to $V_2$'s then-current value 139. The voltage across capacitor 111 at the end of charge transfer ($t_5$) is:

$$\Delta V_{C111} = \text{voltage 134} - \text{voltage 136} = V_1 - V_R \qquad \text{Equation 19}$$

As with the discussion of Equation 1, we note that the amount of charge delivered by capacitor 111 during charge-transfer is simply the change in its voltage multiplied by its capacitance. The initial voltage (before charge transfer) is given by Equation 18, and the final voltage by Equation 19. Thus:

$$Q_T = C_{111}[(V_1 - V_R) - (V_2[t_0] - V_3)] = C_{111}[(V_1 - V_2[t_0]) - (V_R - V_3)] \qquad \text{Equation 20}$$

Equation 20 has exactly the same form as Equation 17, with the static value of $V_2$ in Equation 17 replaced by the sampled value at $t_0$ in Equation 20. This is the desired sample-and-hold property.

Note that, if $V_1$, $V_3$, and $V_R$ are constant as assumed above, then the voltage-to-charge transfer function of Equation 20 can be written:

$$Q_T = -C_{111} V_2[t_0] + (\text{constant}) \qquad \text{Equation 21}$$

If $V_2$ is static, this circuit can be used to generate a sequence of charge packets of uniform size controlled by $V_2$'s value (together with the values of $V_1$, $V_3$ and $V_R$). If $V_2$ is time-varying, then the result is sampling of $V_2$ under control of a (clock) signal $S_{121}$. As Equation 21 shows, the resulting charge packets contain the sampled charge plus a constant term. This constant term is adjustable by varying the values of $V_1$, $V_3$, and/or $V_R$.

In all of the circuits discussed above, the transferred charge $Q_T$ is collected by an output capacitor, for example C33 in FIG. 3. In another application of the boosted charge-transfer circuit, the transferred charge can instead be collected in a storage well of a charge-coupled device (CCD). As just discussed, this capability can be used either for creating a series of constant (adjustable) charge packets, or for producing a series of charge packets which are proportional to samples of a time-varying voltage signal.

Figure 14A:
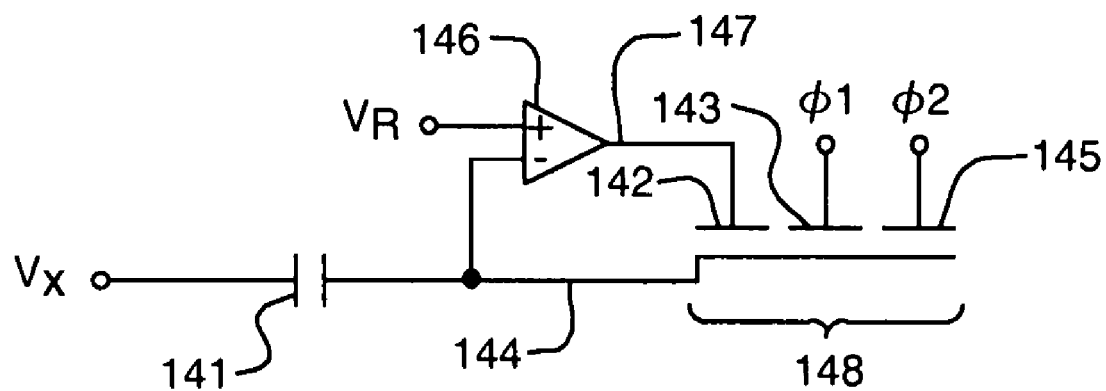
FIGS. 14A and 14B are a circuit diagram and cross-sectional device structure diagram of a boosted charge transfer circuit which provides input charge to a CCD.

FIG. 14A shows a boosted charge-transfer circuit similar to that of FIG. 3, in which the charge-transfer FET and the output capacitor are replaced with CCD elements. $V_X$, capacitor 141, node 144, reference voltage $V_R$, amplifier 146 and amplifier-output node 147 are all precisely analogous to their equivalents in FIG. 3. The new feature in FIG. 14A is CCD 148, consisting of an input terminal connected to node 144 and three gates 142, 143 and 145. (In a practical implementation, the CCD would typically have additional gates beyond gate 145. Three gates suffice to describe the function of this circuit.)

Figure 14B:
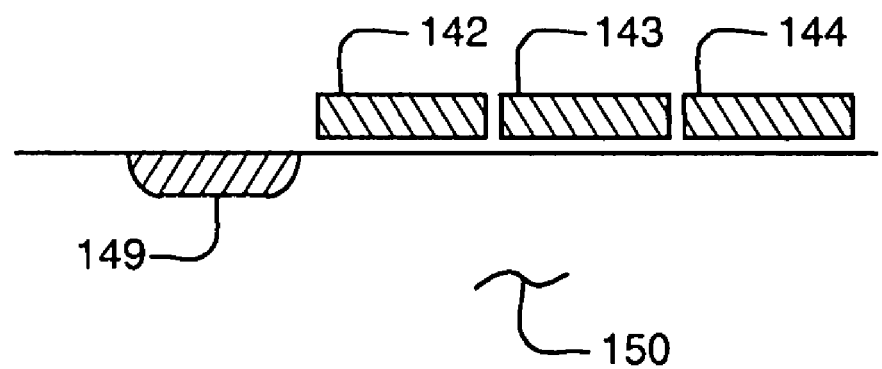

A cross-section representation of the device structure of CCD 148 is shown in FIG. 14B. The input terminal consists of diffusion 149 which has opposite conductivity type to the semiconductor substrate 150. The three gates 142, 143 and 145 are adjacent electrodes, separated from the substrate by a gate dielectric layer, and from each other by dielectric-filled gaps. The CCD schematic symbol used in FIG. 14A corresponds feature-for-feature with the structure shown in FIG. 14B. The structure shown is typical of single-poly CCDs; double-poly and other CCD structures are well-known, and could be used as well in the circuit of FIG. 14A.

In FIG. 14A node 144 is connected to the input terminal 149 of CCD 148. This terminal functions like the source of FET 32 in FIG. 3. The first gate, 142, of CCD 148 is connected to amplifier-output node 147. This gate functions like the gate of FET 32 in FIG. 3, by controlling the flow of current from node 144 into the CCD. Clock voltage $\Phi_1$, when driven to a high voltage, creates a potential well under gate 143. This well is analogous to the drain of FET 32 together with capacitor 33 in FIG. 3: current flowing under gate 142 collects as charge in the well under gate 143, just as current flowing through FET 32 in FIG. 3 collects as charge on capacitor 33. During charge-transfer, clock voltage $\Phi_2$ biases gate 145 off, preventing current from flowing further along the CCD; thus all current flowing under gate 142 is collected in the potential well under gate 143.

The initial condition for the potential well under gate 143 is zero charge. The operation and timing of the circuit of FIG. 14A are identical to those of FIG. 4, except for the aforementioned difference in the means of collection of transferred charge. At the end of the charge-transfer operation ($t_5$ in FIG. 4) the transferred charge $Q_T$ has is accumulated under gate 143, and gate 142 is driven off by amplifier 146. Subsequently $Q_T$ can be transferred along CCD 148 by appropriate clocking of $\Phi_1$ and $\Phi_2$ using well-known CCD methods which are not part of this invention.

All circuits discussed above are shown in single-ended configurations; that is, all voltages are referred to a common reference ('ground'), and all charge packets can have only one sign. (In the case of electrons as charge carriers, the charge packets are always negative; the maximum packet, in algebraic terms, is zero.) It is common to employ differential circuits in practical circuit applications, to provide symmetrical means of representing variables with either sign, for suppression of second-harmonic distortion, and for other reasons. The charge-transfer circuits discussed above can all be used in so-called 'quasi-differential' configurations using a pair of charge packets. In such configurations, the signal is represented as the difference between the two members of the charge-packet pair; each member of the pair also has a bias- or common-mode charge in addition to the signal component. Such circuit configurations are implemented using pairs of the charge-transfer circuits shown, one such circuit to handle each of the members of the charge-packet pair.

While this invention has been particularly shown and described with references to preferred embodiments thereof, it will be understood by those skilled in the art that various changes in form and details may be made therein without departing from the scope of the invention encompassed by the appended claims.

What is claimed is:

1. An apparatus for transferring charge in a charge-domain signal processing circuit, comprising:
    an input charge holding device having a first terminal, disposed in series with and directly coupled to a first voltage input charge source, for holding an input charge;
    an output charge holding device, for holding an output charge;
    a charge transfer device, having an input terminal, an output terminal, and a control terminal, the input terminal coupled to a second terminal of the input charge holding device, the input terminal thereof not being directly coupled to the input charge source, and the the output terminal coupled to provide charge to the output charge holding device under control of a charge transfer control signal applied to the control terminal; and
    an amplifier, having a first input coupled to the second terminal of the input charge holding device, a second input coupled to a reference voltage, and an output terminal coupled to the control terminal of the charge transfer device, for providing the charge transfer control signal, the amplifier configured to control a voltage at the control terminal of the charge transfer device to increase the rate at which the voltage at the input terminal of the charge transfer device settles to the reference voltage.

2. An apparatus as in claim 1 wherein the amplifier provides a gain between approximately 10 and approximately 100.

3. An apparatus as in claim 1 wherein the amplifier comprises an NFET and PFET, each having a terminal connected to a common node, the common node providing the output terminal of the amplifier.

4. An apparatus as in claim 3 wherein a drain terminal of the PFET is connected to a supply voltage, a drain terminal of the NFET is connected to a ground voltage, a gate terminal of the PFET is connected to a bias voltage, and a gate terminal of the NFET is connected to the input terminal of the charge transfer device.

5. An apparatus as in claim 3 wherein the common node is connected to the control terminal of the charge transfer device.

6. An apparatus as in claim 3 additionally comprising:
    a source-follower PFET coupled between the NFET and the input terminal of the charge transfer device.

7. An apparatus as in claim 3, further comprising a second NFET coupled between the input terminal of the charge transfer device and the NFET.

8. An apparatus as in claim 1 additionally comprising:
    a first resistive element coupled between the input charge holding device and the first voltage input charge source;
    a second resistive element coupled between the input charge holding device and the charge transfer device.

9. An apparatus as in claim 1 additionally comprising:
    a current control FET, coupled between the output terminal of the amplifier and a ground voltage, to control ON and OFF times of the charge transfer device.

10. An apparatus as in claim 3 additionally comprising:
    a power control FET coupled between the PFET and a supply voltage.

11. An apparatus as in claim 1 additionally comprising:
    a first input charge control switch, coupled in series between the first voltage input charge source and the input charge holding device; and
    a second input charge control switch, coupled in series between the input terminal of the charge transfer device and a second voltage input source.

12. An apparatus as in claim 1 wherein the charge transfer device comprises a diffusion region formed in a substrate, with a first control electrode formed on the substrate and providing the charge transfer device input terminal.

13. The apparatus of claim 12 additionally comprising a second control electrode formed on the substrate and providing the output charge holding terminal.

14. The apparatus of claim 1, wherein the amplifier comprises a current source coupled to the output terminal of the amplifier.

15. The apparatus of claim 14, wherein the amplifier further comprises a voltage buffer configured to isolate voltage between the input terminal and the control terminal of the charge transfer device.

16. The apparatus of claim 1, further comprising a resistive element coupled to the input charge holding device.

17. The apparatus of claim 16, wherein the resistive element is configured to reduce a non-linear signal distortion during a transfer of charge between the input charge holding device and output charge holding device.

18. The apparatus of claim 17, wherein the resistive element is coupled in series between the input charge holding device and the input terminal of the charge transfer device.

19. The apparatus of claim 17, wherein the resistive element is coupled between an input voltage and the input charge holding device.

20. The apparatus of claim 17 additionally comprising an additional resistive element coupled to the input charge holding device.

21. The apparatus of claim 14 additionally comprising a switch for disabling current through the charge transfer device and the current source, in response to a power switch control signal.

22. An apparatus for transferring charge, comprising:
an input charge holding device, for holding an input charge;
a charge transfer device comprising:
an element having an input terminal, an output terminal, and a control terminal, the input terminal coupled to receive charge from the input charge holding device, a second input terminal coupled to a reference voltage, and the output terminal coupled to provide charge under control of a charge transfer control signal applied to the control terminal; and
a second element, for holding an output charge, and coupled to receive charge from the first element; and
an amplifier for providing the charge transfer control signal, the amplifier having a first input terminal coupled to the input charge holding device, a second input terminal coupled to a reference voltage, and an output terminal coupled to the control terminal of the first element, the amplifier increasing a voltage of the charge transfer control signal relative to a voltage at the input terminal of the first element to increase the rate at which the voltage at the input terminal of the first element settles to the reference voltage.

23. The apparatus of claim 22, wherein the amplifier comprises a current source coupled to the output terminal.

24. The apparatus of claim 22, further comprising a resistive element coupled to the input charge holding device and configured to reduce a non-linear signal distortion during a transfer of charge between the input charge holding device and the second element of the charge holding device.

* * * * *

UNITED STATES PATENT AND TRADEMARK OFFICE
CERTIFICATE OF CORRECTION

| | | |
|---|---|---|
| PATENT NO. | : 8,385,498 B2 | Page 1 of 1 |
| APPLICATION NO. | : 11/807914 | |
| DATED | : February 26, 2013 | |
| INVENTOR(S) | : Michael P. Anthony | |

It is certified that error appears in the above-identified patent and that said Letters Patent is hereby corrected as shown below:

In the Specification:

In col. 1, line 61 should read:
node 4, follows ~~Vx~~ Vx in a negative direction. At time $t_2$, $V_4$ In the Claims:

In col. 11, line 62 should read:
coupled to the input charge source, and ~~the~~ the output In col. 13, line 21 should read:
~~an~~ a first element having an input terminal, an output terminal, In col. 14, line 9 should read:
input terminal couples to a reference voltage, ~~and~~ an In col. 14, line 22 should read:
and the second element of the charge ~~holding~~ coupled device.

Signed and Sealed this
Eighteenth Day of June, 2013

Teresa Stanek Rea
*Acting Director of the United States Patent and Trademark Office*